United States Patent
Labeyrie

[19]

[11] Patent Number: 6,044,102
[45] Date of Patent: Mar. 28, 2000

[54] LASER TRANSMITTING OR RECEIVING DEVICES AND METHOD FOR OPTICALLY TRANSMITTING INFORMATION

[76] Inventor: Antoine Labeyrie, Observatoire de Haute Provence, 04870, Saint-Michel-de-l'Observatoire, France

[21] Appl. No.: 08/952,957

[22] PCT Filed: May 23, 1996

[86] PCT No.: PCT/FR96/00775

§ 371 Date: Nov. 24, 1997

§ 102(e) Date: Nov. 24, 1997

[87] PCT Pub. No.: WO96/37933

PCT Pub. Date: Nov. 28, 1996

[30] Foreign Application Priority Data

May 23, 1995 [FR] France ................................. 95 06104

[51] Int. Cl.[7] ........................... H01S 3/08; H04J 14/00
[52] U.S. Cl. .......................... 372/96; 372/43; 372/45; 372/46; 372/50; 359/115; 359/124
[58] Field of Search ........................... 372/43, 45, 46, 372/47, 50, 92, 96, 102; 359/115, 124, 130

[56] References Cited

U.S. PATENT DOCUMENTS 4,400,813  8/1983  Kaminow ................................. 372/45
4,873,696  10/1989  Coldren et al. ........................... 372/96
5,497,253  3/1996  Stoll et al. ............................... 359/29
5,553,091  9/1996  Delorme ................................. 372/50
5,835,521  11/1998  Ramdani et al. ......................... 372/96

FOREIGN PATENT DOCUMENTS 0370443  5/1990  European Pat. Off. ............. 372/45 X
0651477  5/1995  European Pat. Off. ............. 372/45 X

OTHER PUBLICATIONS

Davis et al., A Transfer Matrix Method Based on Large–Signal Dynamic Model for Multielectrode DFB Lasers IEEE Journal of Quantum Electronics, vol. 30, No. 11, (Nov. 1994).

Primary Examiner—Brian Healy
Attorney, Agent, or Firm—Fulbright & Jaworski, LLP

[57] ABSTRACT

In a transmission laser feeding an optical fibre to which it is coupled, the method comprises providing a Lippmann effect structure with thin stratifications by injecting into the laser light-guide a series of individual modulating electrical currents, applied via a photoemissive medium (12) to a plurality of discrete electrodes (1–6) regularly spaced along the path of the transmitted laser beam (18), so that the optical fibre carries a light spectrum corresponding to the Fourier transform of the set of data input by said modulating currents as electrical signals.

12 Claims, 3 Drawing Sheets

LASER TRANSMITTING OR RECEIVING DEVICES AND METHOD FOR OPTICALLY TRANSMITTING INFORMATION

The present invention is related to the conception and implementation of devices for emitting and/or receiving beams of laser light for the distant transmission of information by optical means. It relates particularly to devices using the modulation of a laser beam to transfer digital (numeric) information data in the form of electrical signals.

BACKGROUND OF THE INVENTION

In that field, and also in a more general way, the beam carrying the information is monochromatic at a frequency identically adjusted in the emitting and the receiving lasers. It is transmitted between them through an optical fiber.

Different types of semi-conductor lasers are known that have very small dimensions and serve in particular for emitting and receiving information data carried from the emitter to the receiver through optical fibers. One may distinguish vertical and horizontal lasers. In both cases, considering for example the emitting laser, modern solutions consist in ensuring the stimulated emission of light in a wave guide made from an active semi-conductor material and in causing modulation by applying to this wave guide an electrical current which is placed under the exciting control of a voltage signal carrying binary data to be transmitted so as to consequently vary the emissivity of the active material or its refractive index.

As concerns the prior art relating to the present invention, one may refer in particular to French patent document FR-A-2 639 773, which recalls the principle of semi-conductor lasers with distributed feed-back, known as DFB, incorporating a Bragg reflector (DBR). An emitting diode laser of this type, implemented as a monolithic structure, comprises superposed layers defining a light guide limited by confinement layers, which itself is made of a ribbon of active electro-optical material coupled with a passive layer. Along a direction of light propagation assumed horizontal, one distinguishes mainly a section where amplification of a stimulated photonic emission occurs at a wavelength which depends upon the material used, a phase matching section, and a section with a periodic Bragg grating the periodicity of which is in relation with a diffraction grating inscribed in the adjacent passive film so as to induce a thickness variation in the wave guide.

The light beam is emitted following the liberation of photons under the effect of an excitation current injected in the first section of the laser and of the selective amplification of the so-called Bragg wavelength caused by the resonance between the Bragg grating and an opposite reflective mirror. A modulation of this wavelength in the light leaving the laser is obtained by controlling the effective refractive index of the active material, using an electrical current applied through the grating section.

Document EP 0395 315 describes a laser of a different type, belonging to the class of the so-called vertical lasers. In this case, the Bragg stratification of the semi-conductor material extends no longer in the longitudinal direction of the laser, but throughout superposed layers parallel to the underlying substrate supporting the assembly, so that the emission of light occurs from the laser surface orthogonal to the longitudinal direction, whereas in horizontal lasers the beam exits through the laser's edge. The same document describes also with ample detail the way how the useful properties are obtained locally in each functional zone from a single semi-conducting crystal, through generating properties differing in the sign of the free carriers and in doping.

In practice, relating to the field of communication by data transmission through optical fibers, the research efforts have mainly been directed, these last few years, towards reducing the size of emitting and receiving lasers, and towards improving the quality by increasing the accuracy of the carrier frequency and the amplitude gain brought by the Bragg diffraction gratings limiting the resonating cavity in monolithic structures of transparent materials. The development prospects for applications of such structures are widely connected to the acquired capability for implementing the needed successive layers by techniques such as molecular beam epitaxy and chemical vapor deposition.

SUMMARY OF THE INVENTION

But the industry still remains expectant to witness increased amounts of information transmitted per unit of time.

To achieve it, the present invention proposes essentially to combine known principles of current laser devices with a novel excitation mode for the active material which involves inducing its stratification into a Lippmann structure showing a profile that is adjustable at each instant.

The phenomenon observed by Lippmann a hundred year's ago is not new in itself. It resides in the fact that, upon reflection on a mirror, different light frequencies in a color image result in the formation of standing waves which inscribe fine stratifications in the depth of a light-sensitive (or photosensitive) layer.

Conventional holography does not exploit the same phenomenon, because it does not involve fine stratifications like in a Lippmann structure. The interference fringes which reconstruct the tri-dimensional image are comparatively broad, on the surface of a thin layer. They result in a diffraction grating which does not reflect but disperses angularly the light as does a prism. Let us however recall that it has been formerly proposed to use the Lippmann's effect in a technics for so-called volume or Lippmann's holography wherein monochrome or coloured holograms are obtained that can be observed under white light.

Then, fine stratifications inside the interference patterns reflect selectively those wavelengths that were used when recording.

Besides, another international patent application filed by the present applicant under same priority date from French patent application Nr 9506554 describes using the Lippmann's effect inside optical fibers to register in them information data under a remarkably high density.

Interference phenomena are also used in current semi-conductor lasers, when they include a Bragg reflector to tune the beam propagated in the wave guide to a well defined light frequency. But in that case one aims essentially at causing the wave guide to resonate at the desired frequency, in such a way as to obtain a truly monochromatic beam. The Bragg's effect represents a specific case of the Lippmann's effect and it leads to a laminated structure including only one periodicity.

SUMMARY OF THE INVENTION

In the context of information data transmission through optical means, the present invention relates to a process as well as to devices for its implementation, that exhibit novel characteristics as claimed hereafter, which can be considered separately or in any technically operative combination.

BRIEF DESCRIPTION OF THE INVENTION

According to a preferred implementation mode of the invention, one injects into the waveguide (or light guide) of electro-active material in an emissive laser of a type known in itself, in particular at the level of a Bragg grating the refractive index of which varies as a function of an electrical current injected across it, a series of different modulation currents respectively applied through separate electrodes into segments of active material regularly spaced along the light propagation direction and forming a Lippmann's stratification structure.

One thus achieves data transmission in a laser beam by propagating the beam through internal reflections under monomode guidance along an optical fiber optically coupled with the emitting laser, in the form of a multitude of multiplexed light wavelengths which cumulate and carry within the resulting spectrum the whole set of data input by the different excitation currents injected at the modulation inputs, each such current being modulated independently from the others.

At the opposite receiving end of such an optical transmission fiber, one arranges a receiving laser which implements the present invention in a manner symmetrical to the emitting laser, but which is here effective in absorption rather than emission of light.

The essential difference resides in the fact that the active photon emitting material is replaced by a photosensitive material, so that the cumulative wavelength variations reaching the receiving laser induce, through the Lippmann effect, corresponding modulations in the electrical signals received by a series of electrodes evenly spaced like in the emitting laser. It is a photo-electric version of Lippmann's color photography process; the silver bromide microcrystals used in the latter are here replaced by a series of photosensitive elements individually connected to a series of electrodes.

In scientific terms, one can describe things more simply by indicating that the multiple electrode emitting laser generates a Fourier transform of the distribution representing at a given time the set of information-carrying signals in electrical form as they are translated in the optical form, and when receiving one retrieves these signals through an inverse Fourier transform, from the optical to the electrical form.

The different excitation electrodes acting on the refractive index and the emissive gain of the photo-emissive wave guide provide in a sense a series of communication channels utilized for multiplexing the emission of information at the entrance of an optical fibre. At the receiving end, the demultiplexing action proceeds in the same way for retrieving the signals received into appropriate electrical connections respectively connected to the different electrodes of the receiving diode laser.

One will remark here that multiplexing is sometimes mentioned in the prior art, but then only serves, unlike the invention, to combine into a single optical fiber optical beams coming from different emissive diodes, and at the receiving end, the light spectrum is analysed by other means.

According to the invention, owing to the multiplicity of the modulation electrodes, a single laser emitter ensures the multiplexing. And whereas the receiving end any means can be used to analyse the optically transmitted spectrum, it is preferable, for convenience and efficiency as well as for safety in the information reliability, to also operate with a single detector laser.

According to a particularly advantageous mode of implementation of the invention, in its application to optical fiber communications, one acts upon the Bragg-reflector resonator structure of a laser, locally at each point, and thus, by a command input admitting a binary electrical voltage separately at each electrode, one ensures the individual modulation of each among the different wavelengths that can be separately generated in a Lippmann structure.

We will now describe in more detail several particular forms of implementation for the invention which will make its goal more understandable with its essential characteristics and its advantages, it being however understood that in their details, these forms of implementation are chosen as non-limiting examples.

BRIEF DESCRIPTION OF THE DRAWINGS

This description is illustrated by the appended drawings, in which.

Figure 2:
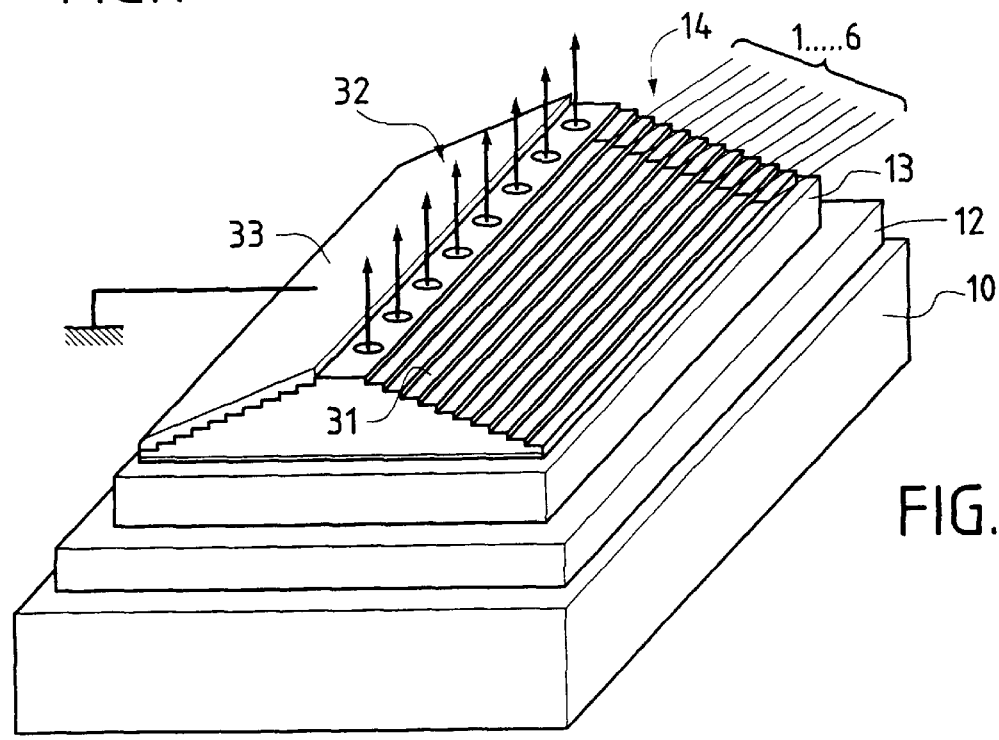
Figure 3:
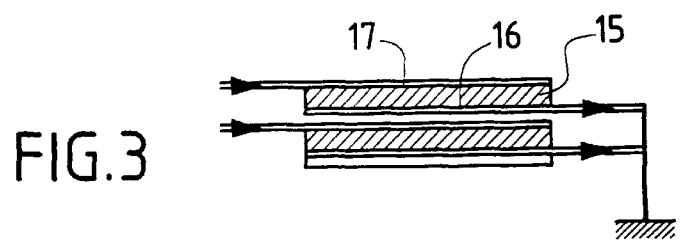
Figure 4:
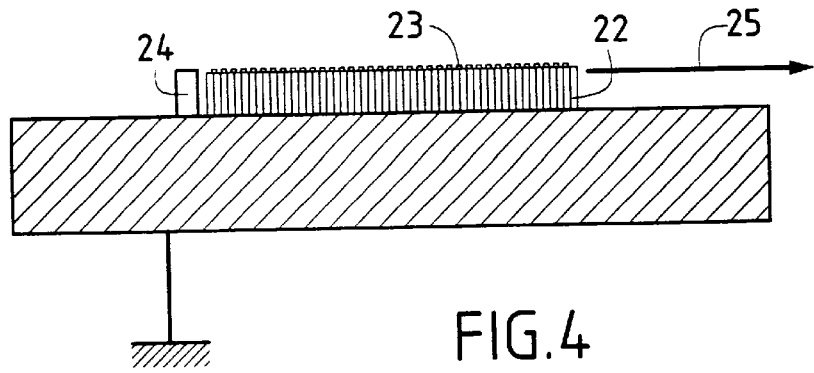
Figure 5:
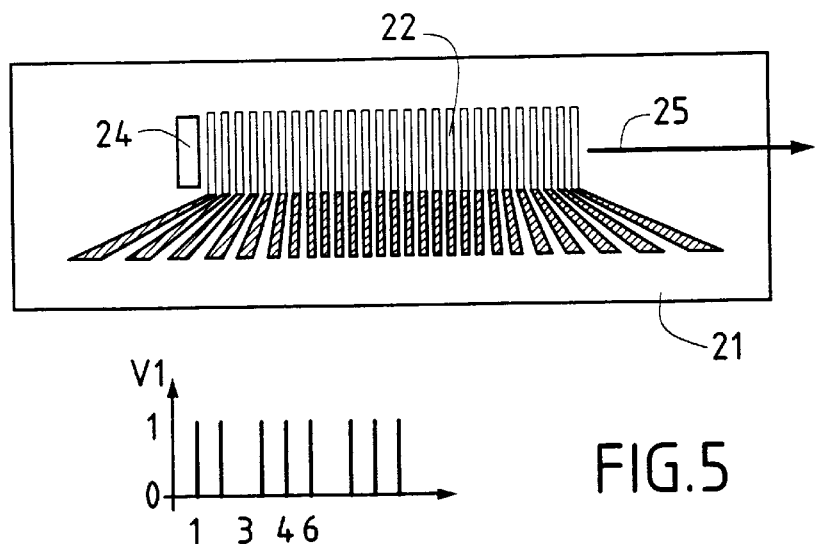
Figure 6:
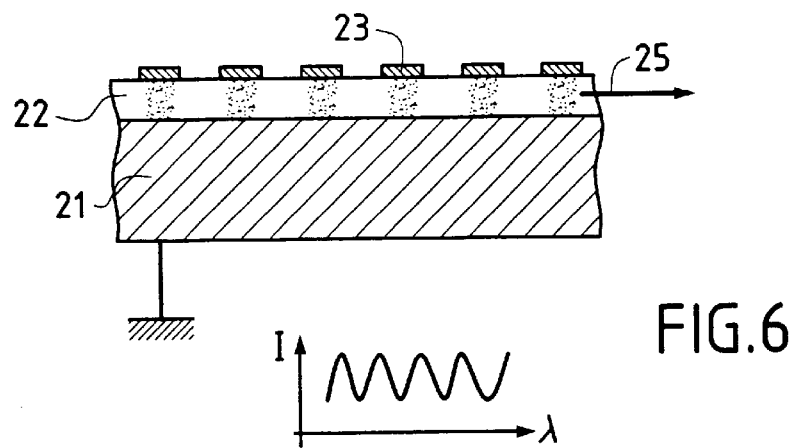

The perspective view in FIG. 2 represents in the same way a vertical laser producing several beams of laser light, each in accordance with the invention;

FIG. 3 illustrates a detail of the layers in such a laser;

FIG. 4 illustrates the invention in the principle of its application to the case of a horizontal laser seen in cross-section;

FIG. 5 shows the same horizontal laser viewed from above, with a scheme for distributing modulation voltages at a determined instant;

FIG. 6 sketches an enlarged part of the emissive laser device of FIGS. 4 and 5 in action, and illustrates an instantaneous light spectrum.

Figure 7:
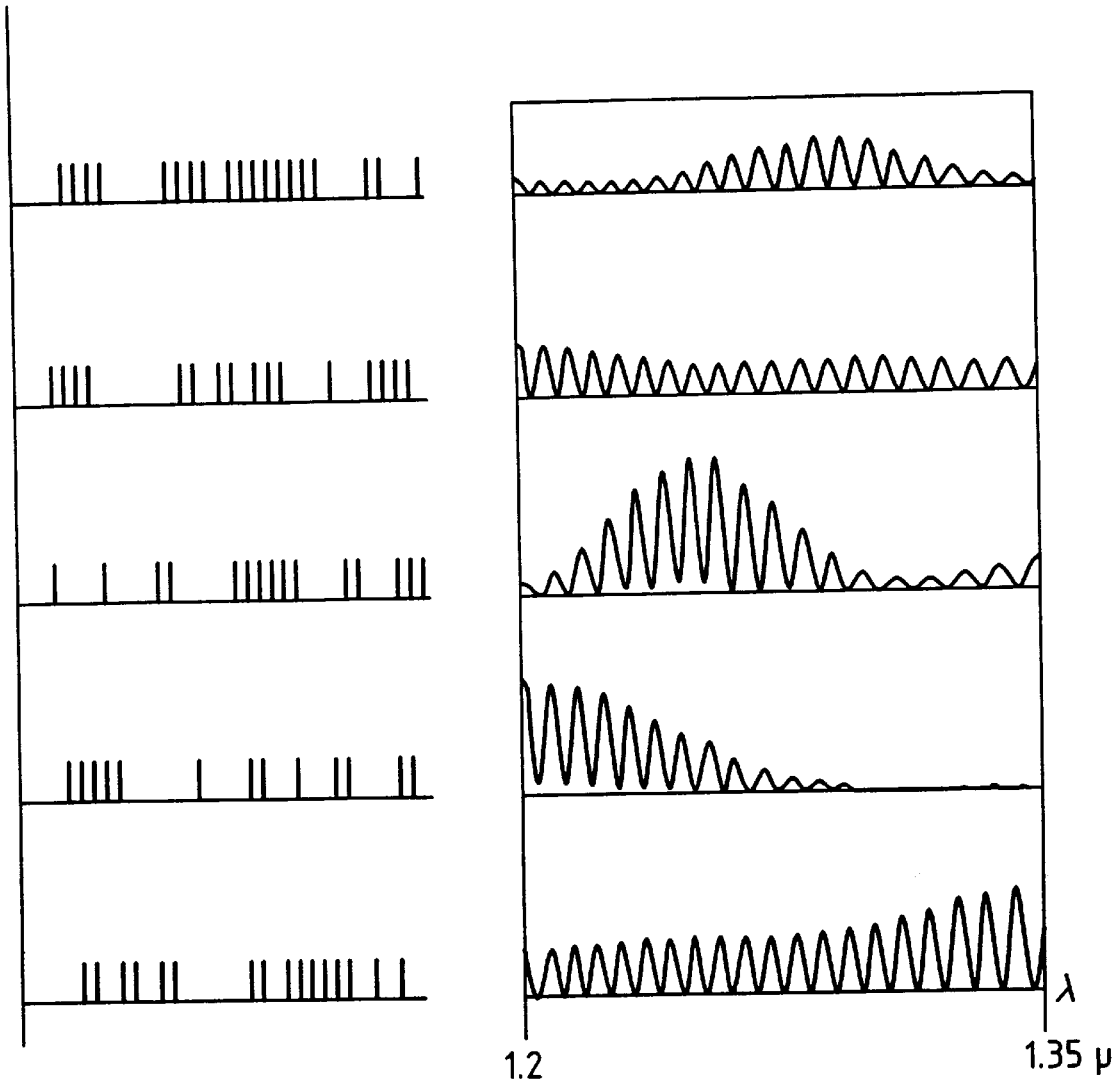

FIG. 7 shows graphical representations of signals from 1.2–1.3 microns.

DETAILED DESCRIPTION OF THE INVENTION

Whether the laser diode is of the horizontal type (beam emitted from the edge of a semi-conductor laser) or the vertical type (emission orthogonal to the surface), it remains that according to the invention, one follows the operation principles of conventional monolithic diode lasers which consists in emitting or detecting data carried by a laser beam (generally transmitted through optical fibers, between an emitter and a detecting receiver) the intensity or base frequency of which is modulated as a function of said data. The latter can take the form of more or less calibrated pulse trains.

In the case of horizontal lasers, a resonance cavity is formed between two reflectors, of which in the example described more specifically here, one at least implies a Bragg grating obtained from a physical waviness of constant pre-defined periodicity, causing a variation of the thickness of the active semi-conductor layer as considered in the longitudinal direction of the light guide incorporated within the laser's monolithic structure.

In the case of vertical lasers, one also finds a structure of reflective grating providing the same resonator role for a pre-defined frequency, but this time, one has a plurality of superposed layers arranged parallel to the face of the laser's own emitting (or receiving) light guide, so that the information carrying beam is normal to this face.

In either case, the excitation of an emitting laser is obtained by applying an electrical voltage modulating the optical signal between two electrodes located in such a way as to vary the refractive index and/or the emissive gain within the successive layers or segments forming the Bragg grating. In a symmetrical manner, the detection is achieved within the structure made of photosensitive material, by activating the receiving electrical current as a function of the incident information carrier beam.

With respect to this state of the art, the invention consists essentially in segmenting or multiplying the electrodes which translate the information data from their electrical to their optically coded form and vice-versa.

Figure 1:
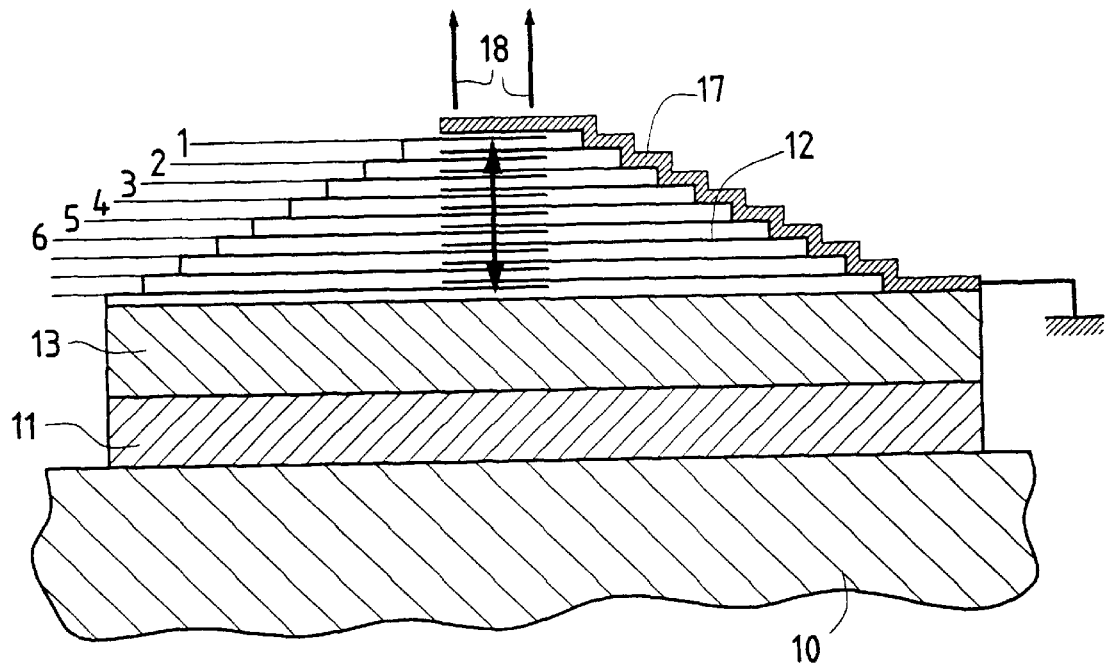
FIG. 1 shows a schematic cross section of a vertical-type emitting laser, according to the invention.

In a particularly elaborated form of implementation according to the invention, FIGS. 1 and 2 illustrate schematically a diode laser used as an emitter. The demultiplication of the electrodes is implemented in such a way as to emit, within each output laser beam, the multiplexed data from a series of electrical signals.

FIG. 1 shows a single output beam, whereas the perspective drawing of FIG. 2 shows a series of adjacent beams, parallel to each other, simultaneously emitted. Each information-carrying beam is then transmitted through a simple optical fiber, connected by optical coupling to the corresponding emissive spot at the laser output, in a way which is conventional in itself.

It is shown on these drawings that the monolithic semiconductor laser structure, of vertical type, comprises, in superposed layers on a substrate 10, first an optical reflector 11, formed in fact by a series of identical layers with alternating different refractive indices, then a passive transmitting layer, acting as an intermediate spacer before an active stack 12, which is also comprised of superposed layers.

It is at the level of this stack of layers 12 that the modulation command occurs, through excitations by an electrical current having a variable potential with respect to a ground electrode.

For optimal performance, it is provided that each active layer has a thickness not exceeding a quarter of the base wavelength of the light beam 18 emitted orthogonally to the layers.

In agreement with the invention, and as better shown in the detail of FIG. 3, each of the layer, here numbered from 1 to 6 in the stack (which can include several tens or hundreds of them), is placed between its own electrodes. For example, layer 15 (FIG. 3), made of a semi-conductor material based on gallium arsenide for example, is sandwiched between an electrically conductive transparent layer 16 connected to the ground electrode, and an electrically conductive layer 17 to which is applied a modulated excitation current, in a way specific to layer 15. The modulation causes a more or less important variation of the functional electro-optical parameters of the active layer, i.e. its emissive gain and its effective refractive index, with respect to the nominal values of these parameters at constant current.

An electrically insulating layer separates two contiguous electrodes respectively serving for excitation current input and output in two successive layers.

It has been attempted to show schematically in FIG. 1 that the part of each layer 15 which is active in photonic emission and thus participates to the Lippmann scattering array, is in practice reduced to a central band in a zone having the same width from layer to layer.

This feature is especially justified when, as illustrated, the superposed layers are formed in a stair-shaped semiconductor structure, with a decreasing width from the substrate (more exactly from the passive layer 13) to the output of the emitted laser beam 18. Such a stair-shaped arrangement facilitates considerably the implementation of the electrical connections necessary on each side.

On the side of the input electrodes 1 to 6 which enter the excitation currents, each electrically conductive layer is accessible at the surface of the corresponding active layer 15. On the opposite side, the layer serving as the output electrode is accessible at the surface of the next underlying active layer in the stack. The current is there carried to the ground by a layer of electrically conductive coating which covers the full surface of the stair steps, for example a layer of continuous metallization coating 17.

Whether they be essentially optical or electrical in their function, the different layers of the stack, which follow each other in a repetitive manner and are all transparent to light at the laser wavelengths, can be produced by methods in themselves conventional, starting from a monolithic substrate.

From this point of view, many documents accessible to the man of the art have widely described the ways in which can be applied, in particular, the techniques of molecular epitaxy growth or of chemical vapor phase deposition, in order to create layers differentiated in sign and/or density of free carriers, as well as layers forming transparent surface electrodes.

The operation of the emitting laser just described is in itself conventional with respect to the resonator cavity (here vertical) causing the emission of a coherent monochromatic light beam, at a base wavelength which depends on the refractive index of the optically active layers and on the pitch of their spatial repetition responsible for the scattering array effect.

More precisely, a wavelength $\lambda$ is specifically amplified through the appearance of standing waves in the stack when the spacing pitch between the layers equals $\lambda/2$ for the effective refractive index created under the influence of the nominal excitation current. The latter can possibly be zero when the functions of photonic emission and of fundamental amplification are ensured otherwise.

The invention combines with the usual solution a modulation of the electrical current causing a variation of the gain and/or effective index parameters in the active material which is induced individually in each layer. Each modulation contains information data, generally in binary form, carried by the current injected in the input electrode of a layer. It is exerted in a temporal way, as voltage variations between steep-front-edged pulses in the example considered here. The complete set of the different currents has a proper spatial distribution at every instant similar to that illustrated in FIG. 5.

From then on, the instantaneous spectrum of the emitted light ray is the Fourier transform of the distribution of modulated exciting voltages, cumulating at every time the set of pulses applied to the different active layers by their respective entrance or input electrodes, with for each an identical weight inasmuch as the electrode's interaction is linear.

In practice, the electrode behaviour is indeed of the linear type when the exciting voltages remain relatively low. For high emission levels, there may appear non linear behaviours, and the spectrum emitted at one instant is no longer a simple exact Fourier transform of the exciting signals.

In other words, whereas the emitted wavelengths correspond to standing waves having their maximums within the active emissive layers, a linear combination of the effect of varied excitations, controlled independently from each other via the electrodes, leads to a spectrum of instantaneous laser light intensity schematically illustrated on FIG. 6, which represents the Fourier-transform coded equivalent of the modulations distribution simultaneously received by different equally spaced electrodes. The multiplexing of the input information data has been performed thereby.

FIG. 7 is a better representation of a series of different spectrums, as they are obtained (right side) on wavelengths from 1.2 to 1.35 microns, in correspondance with the exciting signals composition (left side). It relies on Fourier transform calculations effected supposing that the exciting signals are of the on/off type. The laser geometry in that case comprises a mirror distant by 30 microns from he active segmented part, and the latter coprises 30 electrodes spaced by 200 nanometers. The mean refractive index of the material is 1.5.

As an example, if at a determined instant, the emitting laser described receives the same modulation of the excitation current into every second electrode, the emitted laser beam has a mode configuration equivalent to that of a distributed feedback laser using a Bragg grating, carrying a single predetermined wavelength for an appropriate spacing between the layers receiving the excitation current and the opposite reflecting mirror.

A computer simulation involving the linear accumulation of different spectra corresponding to differently arrayed stimulations, shows that it is advisable to adjust the thickness of the intermediate spacing layer 13 in the resonating cavity in such a way that the resulting optical spectrum does not spread across too wide a band, in view of a spectral analysis which should usefully be done in optimal fidelity conditions.

Such requirements are met if, for example, layer 13 features a thickness of 30,000 nanometers, and if the sampling pitch between electrodes with same polarity is 200 nanometers, for a laser radiation the wavelength of which varies varies as in function for the individual modulated currents by not more than 1% with respect to a base monochromatic emission at from 0.4 to 1 micron.

The transmission of information to be carried in optical fibers causes no special problem. As a comparison, one knows how to carry in this way multiplexed optical signals, in a very large number of transmission channels crossing a single optical fiber. Such is the case in known situations in the field of television, for multiplexing 100 to 1000 communication channels, being understood that contrary to the present invention, the known multiplexing methods would require as many emitting lasers as there are channels, and would not be performed using a single diode laser structure as described here.

In an example according to the invention, for an emission comprised within a spectral band spanning from 1 to 1.01 micron, the stack 14 contains 100 repetitive sets of layers, with a spacing pitch between identical layers equal to 0.2 micron, and the active zone area the electro-optical properties can be modulated extends 20 microns. Generally speaking, one can observe that for a same wavelength of the emitted beam, one considers here layers which are twice thinner than in known laser stacks, every second electrode being excited by the current at the modulation voltage and the intermediate ones being grounded. The pulses may for example repeat at 5 to 10 MHz rates, and rates may even reach at least 1 gigahertz.

If one now specially refers to FIG. 3, one may remark that along the same stack, the varied conductive layers for current injection are divided in parallel bands 31, all in vertical correspondence throughout the layers. With the same monolithic laser emitting device, one can thus produce a plurality of vertical beams 32, which each feature a spectrum deriving from a structure with Lippmann stratifications implemented according to the invention and carrying with it the information data brought to the corresponding electrode bands. In this case also, the ground electrode 33 is common to all electrode bands associated to all beams.

Regarding the design of horizontal lasers according to the invention, one will refer, with respect to their specifications equivalent to the conventional design of vertical lasers, to the patent documents accessible to the man of the art, which do not lack examples, often less recent than the vertical lasers.

Nevertheless, FIGS. 4 to 6 illustrate very schematically a form of implementation for when the invention is applied to this case.

One thus sees on FIG. 4 the substrate 21, electrically connected to the ground, so as to form one of the electrodes, that which is single in the laser emitting device considered. The upper side of this substrate carries a ribbon-shaped semi-conductor layer 22, where laser light is emitted, so as to produce a longitudinal beam 25 which exits through the laser edge. At the other end the laser is closed by a mirror 24. The ribbon 22 will often be buried in a groove of the substrate. It can be doubled with one or several complementary layers on one or both faces, for example to create thereby a quantum well structure.

A second electrically conductive layer 23 covers the ribbon 22, but it is segmented in bands transversal to the ribbon. All electrode segments thus form individual electrodes for injecting in the laser distinct modulation currents, each with a variable voltage controlled by the electrical signals which it carries. An insulating layer not represented separates the substrate 21 from the bands of conductive layer along the edges of the emitting ribbon 22. The ribbon 22 is equally segmented parallel to the bands of the conductive layer 23, in step with them.

For the layer 23 as for the ribbon 22, the segmentation pitch is chosen to be less than a quarter of the shortest wavelength (measured in the optical medium) expected to be emitted in the laser output beam 25. As a function of the electrical signal applied to it, each segment of electrode modifies the electro-optical parameters of the emitting ribbon segment facing it, thus influencing the resonance modes of the laser in its ensemble, and thus the spectrum of the light beam 25 which it emits.

Preferably, the waveguide ribbon 22 has a thickness inferior to the pitch of the above-mentioned segmentation. Under this condition, one can dispense with a physical stratification of the light guide in its intrinsic properties, because there is no longer a risk that the modulation action affects the light guide on either side of the strata facing the electrode segment which brings the electrical modulation signal.

As shown on FIG. 6, the different bands of segmented electrodes extend further on the substrate, on one side of the laser proper, as conductors spreading fan-like. This arrangement serves to facilitate the electrical connections with external conductors, capable of ensuring the supply of modulation currents.

One understands from what precedes that, with respect to the prior art, according to which the conventional Bragg structure is monochromatic, with a constant fixed period reflecting a single wavelength, adjusted and submitted to modulations with the average effective refractive index of the structure, the invention leads to combine with Lippmann structures created by the fragmentation in a periodic series of active segments, of the modulation electrode and/or the light guide, at the level of the Bragg's grating. One then ensures, towards the same fiber from a single laser, the simultaneous emission of a multitude of wavelengths, separately modulated in their action on the axial modes of the laser, that is on the instantaneous optical spectrum of the emitted light beam.

In that way, the input information data find themselves multiplexed in the spectrum of the wavelengths carried by a wave guiding fiber optically coupled to the laser. In this respect, the invention differs radically from the multiplexing solutions which where sometimes proposed, inasmuch as the latter require that several distinct lasers be coupled to the same fiber, with each having a single input for a modulating electrical signal, and where they cause numerous drawbacks, particularly in terms of complexity, cost, implementation reliability.

What I claim is:

1. A process for communication involving transmission of information data by optical means, comprising transmitting along an optical fiber a multiplexed coded form of a data set carried by a spectrum corresponding to the Fourier transform of said data set, as obtained by producing a laser beam with fine stratifications of a Lippmann's structure in a laser light-guide photo-emissive active material when injecting in it said data set in the form of electrical signals comprised of a series of individual modulating electrical currents that are applied across said material to distinct electrodes regularly spaced along the path of said laser beam.

2. A process according to claim 1, wherein said currents are injected into a Bragg array via a laser emitting device with distributed feedback.

3. The process according to claim 1 or 2, utilizing a device for communication by transmission of information data by optical means further comprising at least one laser emitting device in the active photo-emissive light guide of which said structure with Lippmann's stratifications is created, said light-guide comprising a series of segments evenly spaced along the path of an emitted light beam, and modulation means associated to each of said segments for injecting individually in each of them an excitation current carrying information data as electrical signals.

4. A process according to claim 1 or 2 utilizing a laser emitting device, further comprising a means for modulating a laser beam emitted in a light guide made of active photo-emissive material, wherein said means include a series of distinct electrodes, evenly spaced along the path of said beam, each being electrically connected to receive an individualized modulation current, whereby a structure with said Lippmann's stratifications is created in said light guide.

5. A process according to claim 4, wherein said laser emitting device is a horizontal laser, in which said light guide in photo-emissive material is under the form of a ribbon, and wherein there is a segmentation pitch of said electrodes which is less than a quarter of the shortest wavelength to be emitted by the laser.

6. A process according to claim 5, wherein said ribbon shows a stratification of at least its emissive gain or refractive index, with a same segmentation pitch facing said electrodes.

7. A process according to claim 5, wherein the thickness of said ribbon is less than said pitch of said electrodes.

8. A process according to claim 4, wherein said laser emitting device is a vertical type laser, comprising a Bragg grating made of a stack of layers of photo-emissive material, wherein said modulation currents are applied separately to the electrodes formed onto each of said layers.

9. A process according to claim 8, wherein each layer of the stack has a thickness amounting at most to a quarter of the wavelength of the beam emitted across the stack.

10. A process according to claim 1 or 2, wherein a laser receiving device is used and said laser receiving device has a light sensitive light-guide wherein cumulative wavelength variations that reach said laser receiving device in said light beam induce through the Lippmann effect corresponding modulations into electrical signals in a series of electrodes regularly spaced along the path of said laser beam.

11. A process for communication involving transmission of information data as a coded form of a data set along an optical fiber, comprising providing said data set in the form of electrical signals comprised of a series of individual modulating electrical currents, injecting said data set into a laser beam emitted from a laser light-guide photo-emissive active material by applying said currents across said material to distinct electrodes regularly spaced along the path of said emitted laser beam, thereby producing therein fine stratifications of a Lippmann's structure, and using said laser beam for transmission in said fiber of said coded form thereby carried by a spectrum corresponding to the Fourier transformation of said data set.

12. A device for communication by transmission of information data by optical means, comprising a laser emitting device for creating a structure with Lippmann's stratifications in a laser beam emitted therefrom, said laser emission device having a photo-emissive light-guide comprising a series of segments evenly spaced along the path of said emitted light beam, and comprising modulation means associated to each of said segments for injecting individually in each of them an excitation current carrying said information data as electrical signals, and further comprising a laser receiver device comprising a structure in which light-sensitive material is used so that the cumulative wavelength variations that reach said laser receiver device from said emission device induce corresponding modulations through Lippmann's effect into electrical signals received in a series of regularly spaced electrodes, whereby said information data as multiplexed in said emission device is demultiplexed in said receiver device.

* * * * *